(12) United States Patent
Lee et al.

(10) Patent No.: US 7,066,643 B2
(45) Date of Patent: Jun. 27, 2006

(54) RADIO FREQUENCY TEMPERATURE SENSOR AND METHOD OF CALIBRATING TEMPERATURE THEREFOR

(75) Inventors: Hsin-Chou Lee, Hsinchu (TW); Wu-Shin Chen, Taipei (TW)

(73) Assignee: Sunplus Technology Co,Ltd., Hsinchu (TW)

( * ) Notice: Subject to any disclaimer, the term of this patent is extended or adjusted under 35 U.S.C. 154(b) by 76 days.

(21) Appl. No.: 10/708,804

(22) Filed: Mar. 26, 2004

(65) Prior Publication Data

US 2005/0135456 A1 Jun. 23, 2005

(30) Foreign Application Priority Data

Dec. 22, 2003 (TW) ............... 92136368 A

(51) Int. Cl.
*G01K 7/32* (2006.01)
*G01K 11/26* (2006.01)
(52) U.S. Cl. .................. 374/170; 331/57; 374/163; 374/117
(58) Field of Classification Search ........... 374/1, 374/170, 171, 163, 117–119; 702/99, 130, 702/133; 716/4; 331/57; 327/512, 513; 377/25, 19; 340/870.17
See application file for complete search history.

(56) References Cited

U.S. PATENT DOCUMENTS

| | | | | |
|---|---|---|---|---|
| 4,549,818 A | * | 10/1985 | Nishikubo et al. | 374/178 |
| 5,180,995 A | * | 1/1993 | Hayashi et al. | 331/57 |
| 5,498,977 A | * | 3/1996 | Pickup | 326/31 |
| 5,550,489 A | * | 8/1996 | Raab | 326/93 |
| 5,638,418 A | * | 6/1997 | Douglass et al. | 377/25 |
| 5,648,766 A | * | 7/1997 | Stengel et al. | 340/870.39 |
| H1744 H | * | 8/1998 | Clayton et al. | 374/117 |
| 5,884,970 A | * | 3/1999 | Howard | 297/362.14 |
| 6,067,508 A | * | 5/2000 | Conn, Jr. | 702/132 |
| 6,160,755 A | * | 12/2000 | Norman et al. | 365/233 |
| 6,404,246 B1 | * | 6/2002 | Estakhri et al. | 327/156 |
| 6,414,559 B1 | * | 7/2002 | Cole et al. | 331/158 |
| 6,476,682 B1 | * | 11/2002 | Cole et al. | 331/176 |
| 6,695,475 B1 | * | 2/2004 | Yin | 374/171 |
| 6,778,028 B1 | * | 8/2004 | Kobayashi et al. | 331/17 |
| 6,806,698 B1 | * | 10/2004 | Gauthier et al. | 324/76.41 |
| 6,850,125 B1 | * | 2/2005 | Norman et al. | 331/65 |
| 6,934,652 B1 | * | 8/2005 | Gauthier et al. | 702/99 |
| 2003/0156622 A1 | * | 8/2003 | Gold et al. | 374/170 |
| 2003/0158683 A1 | * | 8/2003 | Gauthier et al. | 702/99 |
| 2004/0135643 A1 | * | 7/2004 | Clabes et al. | 331/57 |
| 2004/0183613 A1 | * | 9/2004 | Kurd et al. | 331/186 |
| 2004/0190585 A1 | * | 9/2004 | Berndlmaier et al. | 374/1 |
| 2004/0246809 A1 | * | 12/2004 | Sutardja | 365/232 |
| 2005/0070811 A1 | * | 3/2005 | Crowley | 600/549 |

FOREIGN PATENT DOCUMENTS

| | | | |
|---|---|---|---|
| EP | 0516379 A2 | * | 12/1992 |
| JP | 57145409 A | * | 9/1982 |
| JP | 06169237 A | * | 6/1994 |
| JP | 07161921 A | * | 6/1995 |
| JP | 2004219419 A | * | 8/2004 |

* cited by examiner

*Primary Examiner*—Gail Verbitsky
(74) *Attorney, Agent, or Firm*—Jianq Chyun IP Office

(57) ABSTRACT

A radio frequency temperature sensor and a method of calibration temperature therefor are disclosed. An active radio frequency temperature sensor including a ring oscillator, a memory, a frequency counter, a radio frequency transmission interface and a micro-controller is used to calibrate and verify the efficacy of the radio frequency temperature sensor. Thereafter, a passive radio frequency temperature sensor including a regulator, a clock extractor, a ring oscillator, a memory, a frequency counter, a modulator and a state-machine is developed according to the verified results.

10 Claims, 4 Drawing Sheets

RADIO FREQUENCY TEMPERATURE SENSOR AND METHOD OF CALIBRATING TEMPERATURE THEREFOR

CROSS REFERENCE TO RELATED APPLICATIONS

This application claims the priority benefit of Taiwan application serial no.92136368, filed on Dec. 22, 2003.

BACKGROUND OF INVENTION

1. Field of the Invention

The present invention relates to a radio frequency measuring device, and more particularly to a radio frequency temperature sensor and a method of calibrating temperature therefor.

2. Description of the Related Art

Temperature, humidity and pressure are parameters commonly measured at home, offices and in manufacturing plants. Under special circumstances, for example, it is impossible to measure the tire pressure using a conventional measuring device when a car is moving. Accordingly, a radio frequency circuit for remotely and precisely measuring these parameters is required. In conventional art, the radio frequency circuit, the circuit is applied to the measuring devices for measuring temperature, humidity and pressure, and then the measured data is transmitted.

For designing the measuring devices with different applications, the radio frequency integrated circuit is designed and then the measuring devices are being verified for its accuracy or calibrated by modifying the relevant circuits for functioning accurately. However, the prior art method is time consuming and costly. Moreover, the transmission method and efficiency thereof cannot be verified whether the circuit is desired.

SUMMARY OF INVENTION

In the view of the foregoing, the present invention provides a radio frequency temperature sensor and a method of calibrating the radio frequency for verifying its accuracy and the efficacy or for improving its accuracy and efficiency. Moreover, the sensor of the present invention is applied to a passive radio frequency temperature sensor.

The present invention provides a radio frequency temperature sensor. The radio frequency temperature sensor comprises: a ring oscillator, a memory, a frequency counter, a radio frequency transmission interface, and a micro-controller. The ring oscillator is adapted to generate an oscillating signal frequency corresponding to a measured temperature. The memory is adapted to store an initial value. The frequency counter is coupled to the memory and the ring oscillator, and adapted to measure a temperature error in response to the measured temperature according to the initial value and the oscillating signal in a pre-set time. The radio frequency transmission interface serves as a transmission interface with a card reader. The micro-controller is coupled to the frequency counter, the memory and the radio frequency transmission interface, and adapted to transmit the initial value to the frequency counter, to control starting and ending of the pre-set time, to read the temperature error and to communicate with the card reader through the radio frequency transmission interface.

According to an embodiment of the present invention, the ring oscillator comprises: a thermal resistor, a capacitor, a Schmitt inverter, an inverter and a NAND gate. The thermal resistor has a first terminal and a second terminal. The capacitor has a first terminal and a second terminal, the first terminal of the capacitor coupled to the second terminal of the thermal resistor, and the second terminal of the capacitor grounded. The Schmitt inverter has an input terminal coupled to the second terminal of the thermal resistor, and an output terminal. The inverter has an input terminal coupled to the output terminal of the Schmitt inverter, and an output terminal. The NAND gate has a first input terminal, a second input terminal and an output terminal. The first input terminal of the NAND gate is adapted to receive an enable signal. The output terminal is coupled to the first terminal of the thermal resistor. The second input terminal is coupled to the output terminal of the inverter and adapted to output the oscillating signal.

According to an embodiment of the present invention, the memory of the radio frequency temperature sensor is a non-volatile memory.

In the embodiment, the frequency counter of the radio frequency temperature sensor is a down counter.

According to an embodiment of the present invention, the radio frequency transmission interface comprises: an antenna, a diode and a Zener diode. The antenna comprises an inductor coupled to a capacitor in parallel. An anode of the diode is coupled to a terminal of the antenna. An anode of the Zener diode is coupled to another terminal of the antenna, and a cathode of the Zener diode is coupled to a cathode of the diode.

According to an embodiment of the present invention, the micro-controller transforms the temperature error into the measured temperature according to a temperature reference table.

According to an embodiment of the present invention, the micro-controller communicates with the card reader through a general input/output port thereof.

The present invention also provides a method of calibrating temperature suitable for a radio frequency temperature sensor comprising a ring oscillator, a memory and a frequency counter. The method comprises: generating an oscillating signal related to a standard measuring temperature, such as 40° C., by the ring oscillator; measuring a frequency count value of the frequency counter according to the oscillating signal in a pre-set time; and storing the frequency count value in the memory as a initial value of the frequency counter.

The present invention provides a radio frequency temperature sensor according to another embodiment, which comprises a regulator, a frequency extractor, a ring oscillator, a memory, a frequency counter, a modulator and a state machine. The regulator is adapted to receive and transform an oscillating current of an antenna into a working voltage of the radio frequency temperature sensor. The frequency extractor is adapted to generate a clock signal of the radio frequency temperature sensor according to the signal received from the antenna. The ring oscillator is adapted to generate an oscillating signal frequency corresponding to a measured temperature. The memory is adapted to store an initial value. The frequency counter is coupled to the memory and the ring oscillator and adapted to measure a temperature error in response to the measured temperature according to the initial value and the oscillating signal in a pre-set time. The modulator serves as a transmission interface with a card reader. The state machine is coupled to the frequency counter, the memory and the modulator, and adapted to transmit the initial value to the frequency counter, to control starting and ending of the pre-set time, to read the temperature error and to communicate with the card reader through the modulator.

According to an embodiment of the present invention, the ring oscillator comprises: a thermal resistor, a capacitor, a Schmitt inverter, an inverter and a NAND gate. The thermal resistor has a first terminal and a second terminal. The capacitor has a first terminal and a second terminal. The first terminal of the capacitor is coupled to the second terminal of the thermal resistor, and the second terminal of the capacitor is grounded. The Schmitt inverter has an input terminal coupled to the second terminal of the thermal resistor, and an output terminal. The inverter has an input terminal coupled to the output terminal of the Schmitt inverter, and an output terminal. The NAND gate has a first input terminal, a second input terminal and an output terminal. The first input terminal of the NAND gate is adapted to receive an enable signal. The output terminal is coupled to the first terminal of the thermal resistor. The second input terminal is coupled to the output terminal of the inverter and adapted to output the oscillating signal.

According to an embodiment of the present invention, the memory of the radio frequency temperature sensor is a non-volatile memory.

According to an embodiment of the present invention, the frequency counter of the radio frequency temperature sensor is a down counter.

In order to make the aforementioned and other objects, features and advantages of the present invention understandable, a preferred embodiment accompanied with figures is described in detail below.

DETAILED DESCRIPTION

Figure 1:
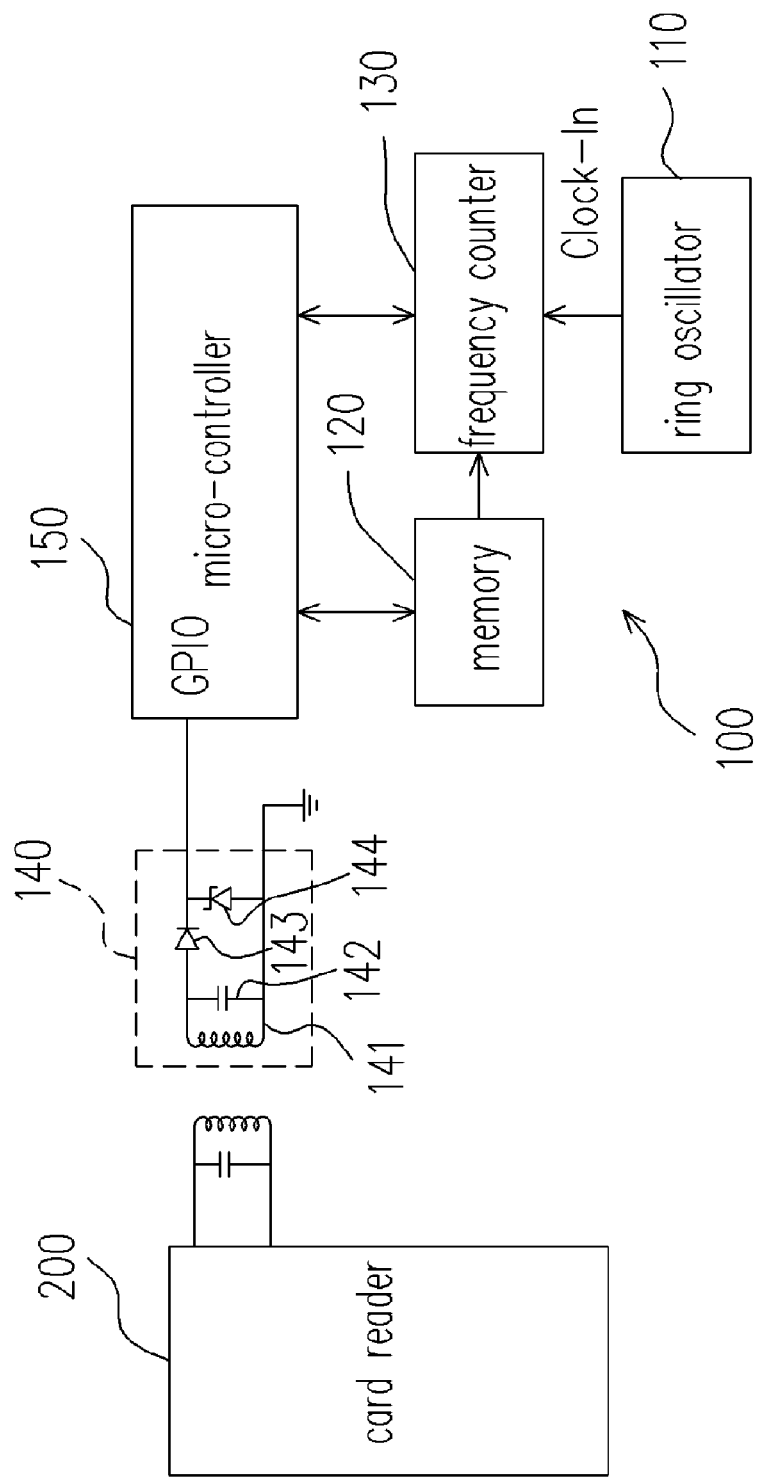
FIG. 1 is a block diagram showing an active radio frequency temperature sensor according to an embodiment of the present invention.

FIG. 1 is a block diagram showing an active radio frequency temperature sensor according to an embodiment of the present invention. Referring to FIG. 1, the radio frequency temperature sensor 100 comprises a ring oscillator 110, a memory 120, such as a non-volatile memory, and a frequency counter 130 for measuring temperature. The measuring principle is described below.

Figure 2:
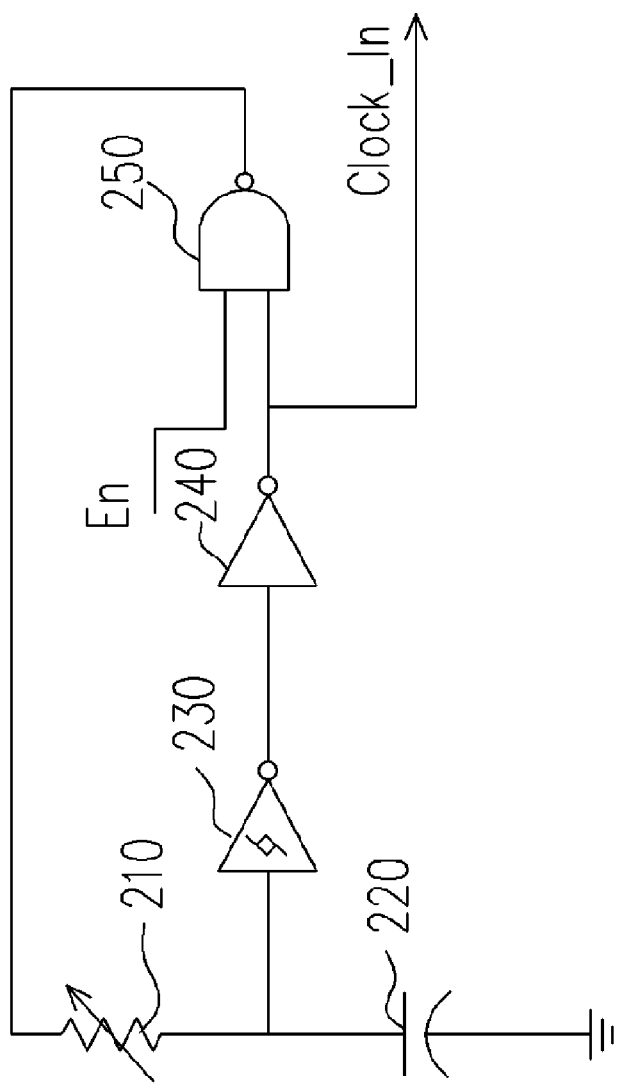
FIG. 2 is a drawing showing a ring oscillator according to an embodiment of the present invention.

First, the ring oscillator 110 is adapted to generate an oscillating signal Clock_in frequency corresponding a measured temperature. The oscillating signal serves as the clock pulse of the frequency counter 130. FIG. 2 is a drawing showing a ring oscillator according to an embodiment of the present invention. Referring to FIG. 2, the ring oscillator 110 comprises a thermal resistor 210, a capacitor 220, a Schmitt inverter 230, an inverter 240 and a NAND gate 250.

Referring to FIG. 2, the thermal resistor 210 comprises a first terminal and a second terminal. The capacitor 220 comprises a first terminal and a second terminal, the first terminal of the capacitor 220 coupled to the second terminal of the thermal resistor 210, and the second terminal of the capacitor 220 grounded. The Schmitt inverter 230 has an input terminal coupled to the second terminal of the thermal resistor 210, and an output terminal. The inverter 240 has an input terminal coupled to the output terminal of the Schmitt inverter 230, and an output terminal. The NAND gate 250 has a first input terminal, a second input terminal and an output terminal. The first input terminal of the NAND gate 250 is adapted to receive an enable signal En. The output terminal is coupled to the first terminal of the thermal resistor 210 forming a ring circuit. The second input terminal is coupled to the output terminal of the inverter 240 and adapted to output the oscillating signal Clock_In frequency corresponding to the measured temperature. The variation of the frequency of the oscillating signal Clock_In results from RC delay of the circuit by the variation of the resistance of the thermal resistor 210 in response to temperature.

Referring to FIG. 1, the thermal resistor of the ring oscillator 110 has an error of thermal constant (B-constant) less than 1%, and an absolute error about 5%. In addition, the capacitor of the ring oscillator 110 has a capacitance error about 5%. In the worst case, the error of the ring oscillator 110 is about 10%. Without adequate calibration, the error of the measured temperature will be not acceptable. The memory 120 serves to store the initial value of the frequency counter 130 as to calibrate the error resulting from the thermal resistor and the capacitor of the ring oscillator 110.

During calibration, the ring oscillator 110 is adapted to generate the oscillating signal Clock_In according to the standard measuring temperature, such as 40° C. By the oscillating signal Clock_in, a frequency count value, such as 2,800, of the frequency counter 130 in a pre-set time is measured. The frequency count value, 2,800, is stored in the memory serves as the initial value of the frequency counter 130.

When the actual temperature is measured, the initial value stored in the memory 120 is transmitted to the frequency counter 130, which can be, for example, a down counter. The initial value is regularly reduced during the pre-set time for obtaining the temperature error with standard temperature 40° C. In other words, when the measured temperature is 40° C., the count value of the frequency counter 130 is 0; when the measured temperature is lower than 40° C., the count value of the frequency counter 130 is less than 0 because of the higher frequency of the oscillating signal Clock_In of the ring oscillator 110; when the measured temperature is higher than 40° C., the count value of the frequency counter 130 is more than 0 because of the lower frequency of the oscillating signal Clock_In of the ring oscillator 110. The temperature error can be transformed into the measured temperature according to a temperature reference table stored in the memory 120 or a card reader 200. When the temperature range to be measured is large, a plurality of frequency count values can be measured as initial value of the frequency counter 130 to obtain a precise result. For example, when the temperature range is from 0–70° C., the initial values of the frequency counter 130 can be measured at 0, 35 and 70° C. for measuring the other temperatures.

Accordingly, the active radio frequency temperature sensor of the present invention is used to calibrate and verify the efficiency thereof. The present invention uses a radio frequency transmission interface 140 and a micro-controller 150 for transmitting the initial value to the frequency counter 130, for controlling the starting and ending of the pre-set time, for reading the temperature error, and for communicating with the card reader 200 thereby. The power of the radio frequency temperature sensor 100 is supplied by an external circuit (not shown). The micro-controller 150 has a general input/output port (GPIO) for communicating with the card reader 200. Following are the descriptions of the communication theory.

Referring to FIG. 1, the radio frequency transmission interface 140 comprises: an antenna, comprising an inductor 141 coupled to a capacitor 142 in parallel, a diode 143 and a Zener diode 144. An anode of the diode 143 is coupled to a terminal of the antenna 141. An anode of the Zener diode 144 is coupled to another terminal of the antenna, and a cathode of the Zener diode 144 is coupled to a cathode of the diode 143.

The resonance frequency of the inductor 141 and the capacitor 142 and the frequency of a carrier signal should be set with same value. When resonance occurs, another terminal of the antenna generates a sinusoid signal. When the sinusoid signal is in negative bias and the GPIO of the micro-controller 150 is coupled to the terminal of the antenna, current is extracted from GPIO of the micro-controller 150 as to result in latch-up effect. Therefore, the GPIO of the micro-controller 150 is coupled to the terminal of the antenna through the diode 143 for filtering the negative bias.

The closer the antenna to the card reader 200, the larger the voltage sensed thereby. If the sensed voltage is not restricted, the device may be damaged when the sensed voltage is higher than the breakdown voltage of the devices of the micro-controller 150. Accordingly, the Zener diode 144 is used to clamp the sensed voltage for protecting the devices.

Figure 3:
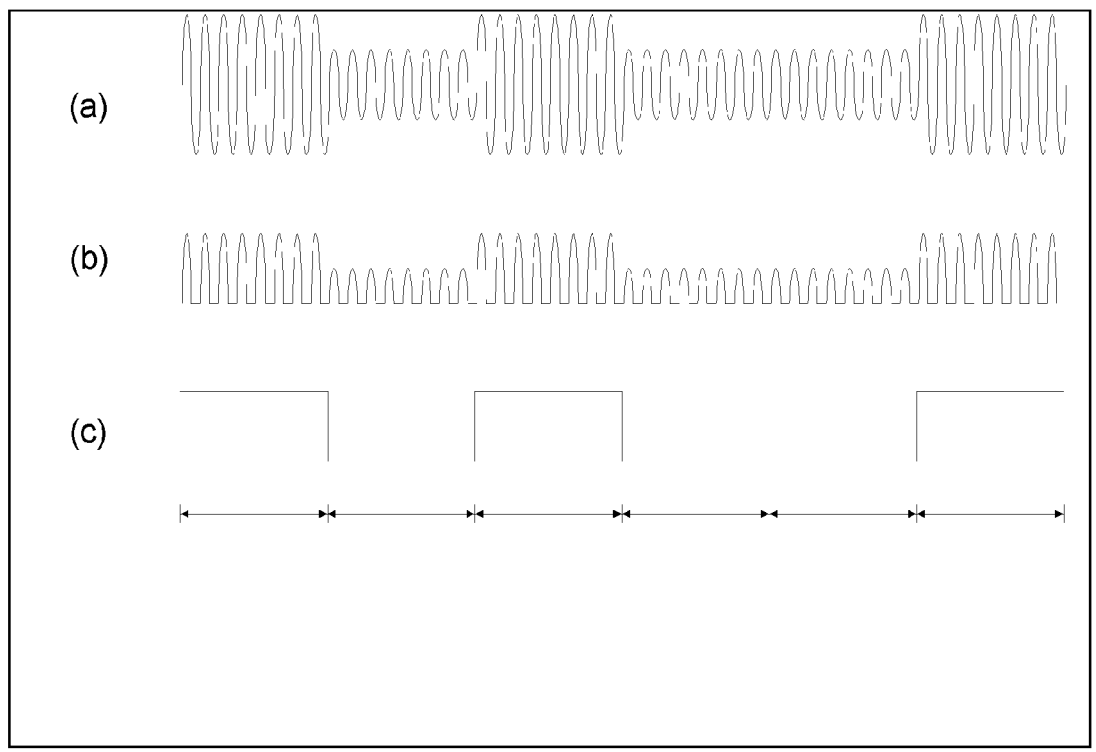
FIG. 3 is an operation waveform of the radio frequency transmission interface 140 of the present invention when the card reader is reading data.

FIG. 3 is an operation waveform of the radio frequency transmission interface 140 of the present invention when the card reader is reading data. Generally, the GPIO of the micro-controller 150 can be set as floating, pull-low-resistor mode, or output low mode by setting the register thereof. In these states, the radio frequency transmission interface 140 has the highest equivalent resistance in floating, the middle resistance in pull-low-resistor mode and the lowest resistance in output low mode. By the variation of the resistance, the amplitude of the carrier signal is changed for transmitting data to the card reader 200.

Referring to FIG. 1, when the card reader 200 transmits the carrier signal, and the radio frequency temperature sensor 100 is close to the card reader 200, the antenna of the radio frequency transmission interface 140 senses the signal and the resonance occurs. Accordingly, the sinusoid signal shows up at the terminal of the antenna. If the signals to be transmitted by the radio frequency temperature sensor 100 are 101001, the GPIO of the micro-controller 150 is set as floating, pull-low-resistor mode, floating, pull-low-resistor mode, pull-low-resistor mode and floating. Therefore, the waveforms at the antenna terminal of the radio frequency transmission interface 140, the GPIO of the micro-controller 150, and the logic level of the signal are shown in FIGS. 3(a), (b) and (c), respectively. Accordingly, the data can be transmitted to the card reader. Although the operation above is performed according to floating and pull-low-resistor mode, it is not limited thereto. One of ordinary skilled in the art can understand that any two of the three states can be applied to perform the operation.

Figure 4:
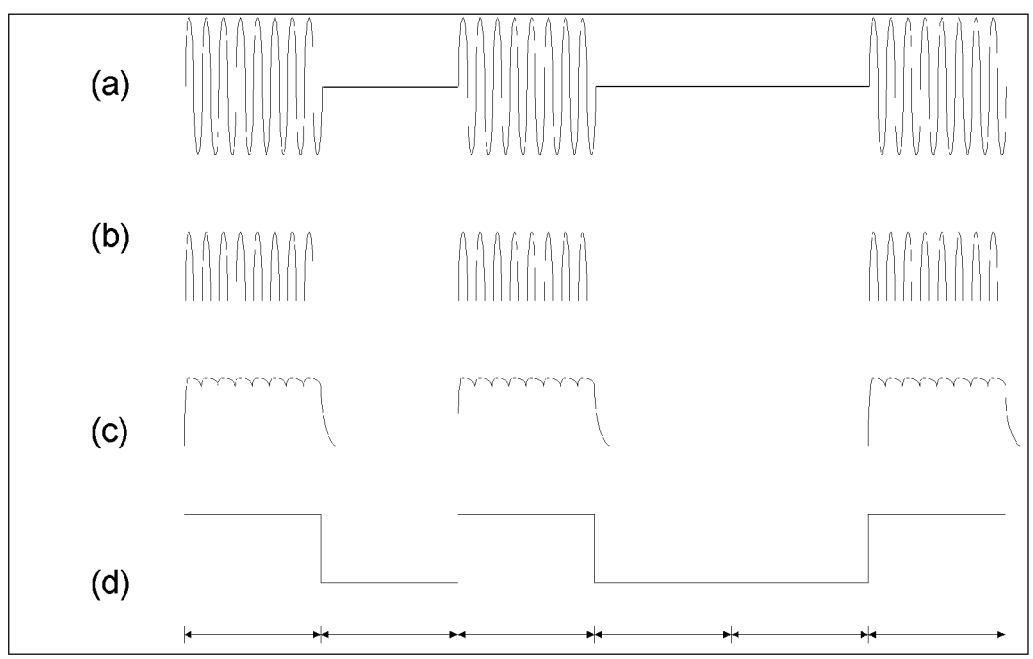
FIG. 4 is an operation waveform of the radio frequency transmission interface 140 of the present invention when the card reader is writing data.

FIG. 4, illustrate an operation waveform of the radio frequency transmission interface 140 of the present invention when the card reader is writing data. When the card reader 200 is in writing mode, the GPIO of the micro-controller 150 is set as pull-low-resistor mode. Then, the card reader 200 transmits the waveform shown in FIG. 4(a). In other words, the sinusoid signal shows up periodically for representing 1 and 0. The radio frequency temperature sensor 100 receives the signal by the antenna, which is filtered by the diode 143 as to generate the waveform of FIG. 4(b). If the parasitic capacitor of the GPIO of the micro-controller 150 is huge enough, the waveform generated at the GIPO of the micro-controller 150 is shown as FIG. 4(c). Therefore, the waveform shown in FIG. 4(d) can be obtained by sampling the voltage of the GIPO of the micro-controller 150 to recover the data transmitted from the card reader 200. Accordingly, the data can be written into the radio frequency temperature sensor 100.

The descriptions above are about the active radio frequency temperature sensor, which uses an external power supply. After the verification, the circuit is transformed into a passive radio frequency integrated circuit without the external circuit.

Figure 5:
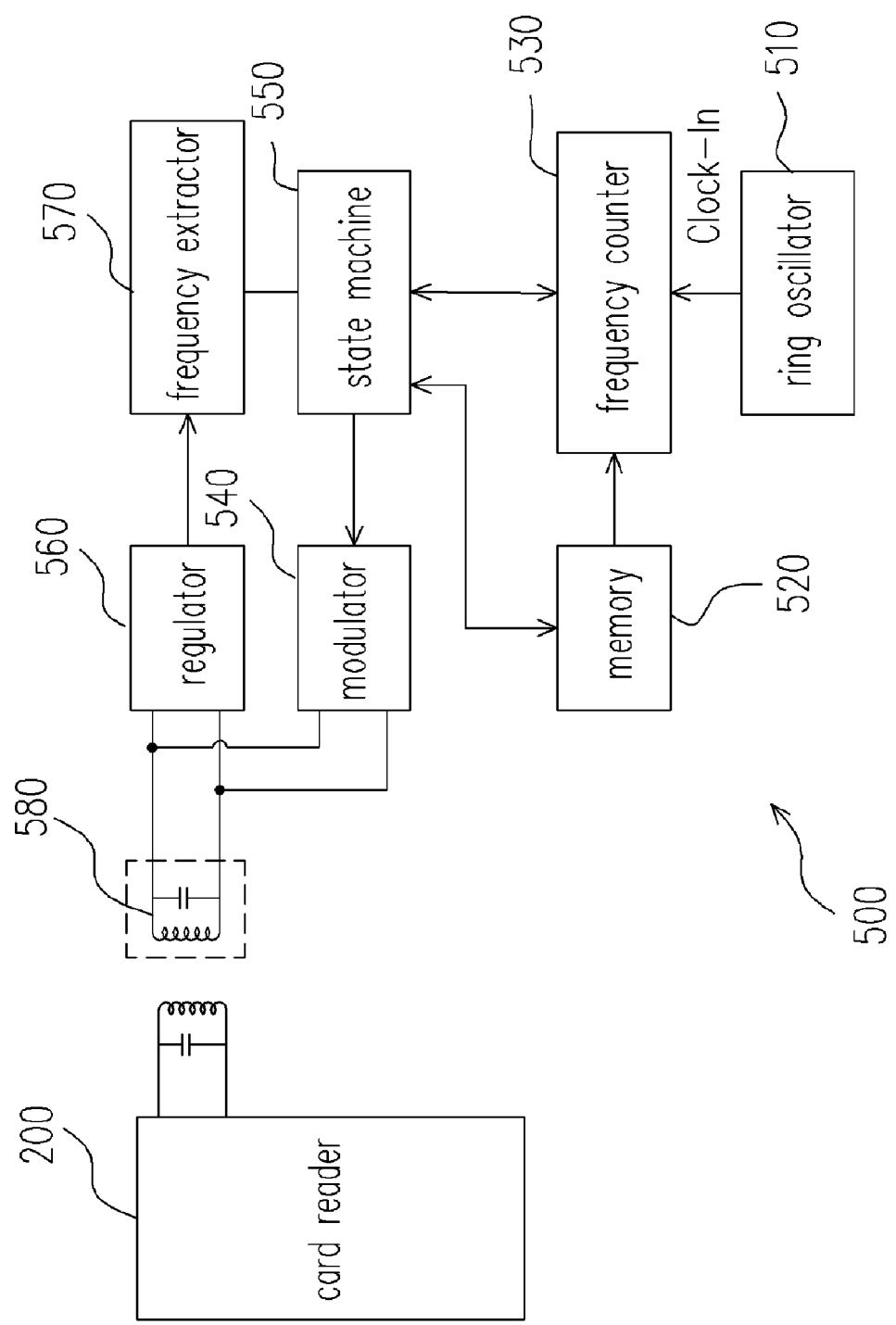
FIG. 5 is a block diagram showing a passive radio frequency temperature sensor according to an embodiment of the present invention.

FIG. 5 is a block diagram showing a preferred passive radio frequency temperature sensor of the present invention. Referring to FIG. 5, the radio frequency temperature sensor 500 comprises: a regulator 560, a frequency extractor 570, a ring oscillator 510, a memory 520, a frequency counter 530, a modulator 540 and a state machine 550. Without the external power supply, the regulator 560 is used to extract the current from the antenna 580, transferring the current into the working voltage of the radio frequency temperature sensor 500. In addition, the frequency extractor 570 generates the clock signal of the radio frequency temperature sensor 500 according to the signal received from the antenna 580. The modulator 540 serves as the transmission interface communicated with the card reader 200. The state machine 550 transmits the initial value stored in the memory 520 to the frequency counter 530, controls the starting and ending of the pre-set time, reads the temperature error and communicates with the card reader 200 through the modulator 540 for replacing the micro-controller 150 in FIG. 1. The detail descriptions of the ring oscillator 510, the memory 520 and the frequency counter 530 are similar to those of FIG. 1, and therefore detailed description thereof are not repeated hereinafter.

Although the present invention has been described in terms of exemplary embodiments, it is not limited thereto. Rather, the appended claims should be constructed broadly to include other variants and embodiments of the invention which may be made by those skilled in the field of this art without departing from the scope and range of equivalents of the invention.

The invention claimed is:

1. A radio frequency temperature sensor, comprising:
a ring oscillator, adapted to generate an oscillating signal frequency varying corresponding to a measured temperature;
a memory, adapted to store an initial value;
a frequency counter, coupled to the memory and the ring oscillator and adapted to measure a temperature error in response to the measured temperature according to the initial value and the oscillating signal in a pre-set time;
a radio frequency transmission interface, serving as a transmission interface with a card reader; and
a micro-controller, coupled to the frequency counter, the memory and the radio frequency transmission interface, adapted to transmit the initial value to the frequency counter, control starting and ending of the pre-set time, read the temperature error and communicate with the card reader through the radio frequency transmission interface.

2. The radio frequency temperature sensor of claim 1, wherein the ring oscillator comprises:
 a thermal resistor, having a first terminal and a second terminal;
 a capacitor, having a first terminal and a second terminal, the first terminal of the capacitor coupled to the second terminal of the thermal resistor, and the second terminal of the capacitor grounded;
 a Schmitt inverter, having an input terminal coupled to the second terminal of the thermal resistor, and an output terminal;
 an inverter, having an input terminal coupled to the output terminal of the Schmitt inverter, and an output terminal; and
 a NAND gate, having a first input terminal, a second input terminal and an output terminal, the first input terminal of the NAND gate adapted to receive an enable signal, the output terminal coupled to the first terminal of the thermal resistor, the second input terminal coupled to the output terminal of the inverter and adapted to output the oscillating signal.

3. The radio frequency temperature sensor of claim 1, wherein the memory is a non-volatile memory.

4. The radio frequency temperature sensor of claim 1, wherein the frequency counter is a down counter.

5. The radio frequency temperature sensor of claim 1, wherein the radio frequency transmission interface comprises:
 an antenna, comprising an inductor coupled to a capacitor in parallel;
 a diode, an anode of the diode coupled to a terminal of the antenna; and
 a Zener diode, an anode of the Zener diode coupled to another terminal of the antenna, a cathode of the Zener diode coupled to a cathode of the diode.

6. The radio frequency temperature sensor of claim 1, wherein the micro-controller transforms the temperature error into the measured temperature according to a temperature reference table.

7. The radio frequency temperature sensor of claim 1, wherein the micro-controller communicates with the card reader through a general input/output port thereof.

8. A radio frequency temperature sensor, comprising:
 a regulator, adapted to receive and transform a oscillating current from an antenna into a working voltage of the radio frequency temperature sensor;
 a frequency extractor, adapted to generate a clock signal of the radio frequency temperature sensor according to a signal received from the antenna;
 a ring oscillator, adapted to generate an oscillating signal frequency corresponding to a measured temperature;
 a memory, adapted to store an initial value;
 a frequency counter, coupled to the memory and the ring oscillator and adapted to measure a temperature error in response with the measured temperature according to the initial value and the oscillating signal in a pre-set time;
 a modulator serving as a transmission interface with a card reader; and
 a state machine, coupled to the frequency counter, the memory and the modulator, adapted to transmit the initial value to the frequency counter, control starting and ending of the pre-set time, read the temperature error and communicate with the card reader through the modulator.

9. The radio frequency temperature sensor of claim 8, wherein the ring oscillator comprises:
 a thermal resistor, having a first terminal and a second terminal;
 a capacitor, having a first terminal and a second terminal, the first terminal of the capacitor coupled to the second terminal of the thermal resistor, and the second terminal of the capacitor grounded;
 a Schmitt inverter, having an input terminal coupled to the second terminal of the thermal resistor, and an output terminal;
 an inverter, having an input terminal coupled to the output terminal of the Schmitt inverter, and an output terminal; and
 a NAND gate, having a first input terminal, a second input terminal and an output terminal, the first input terminal of the NAND gate adapted to receive an enable signal, the output terminal coupled to the first terminal of the thermal resistor, the second input terminal coupled to the output terminal of the inverter and adapted to output the oscillating signal.

10. The radio frequency temperature sensor of claim 8, wherein the memory is a non-volatile memory.

* * * * *